(12) United States Patent
Piccardi

(10) Patent No.: US 11,948,647 B2
(45) Date of Patent: *Apr. 2, 2024

(54) MANAGING DIGITALLY-CONTROLLED CHARGE PUMP OPERATION IN A MEMORY SUB-SYSTEM

(71) Applicant: Micron Technology, Inc., Boise, ID (US)

(72) Inventor: Michele Piccardi, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/902,130

(22) Filed: Sep. 2, 2022

(65) Prior Publication Data

US 2023/0116024 A1 Apr. 13, 2023

Related U.S. Application Data

(63) Continuation of application No. 17/108,293, filed on Dec. 1, 2020, now Pat. No. 11,443,816.

(51) Int. Cl.
*G11C 16/00* (2006.01)
*G11C 16/08* (2006.01)
*G11C 16/10* (2006.01)
*G11C 16/26* (2006.01)
*G11C 16/30* (2006.01)
*G11C 16/34* (2006.01)

(52) U.S. Cl.
CPC .............. *G11C 16/30* (2013.01); *G11C 16/08* (2013.01); *G11C 16/10* (2013.01); *G11C 16/26* (2013.01); *G11C 16/3404* (2013.01)

(58) Field of Classification Search
CPC ......... G11C 16/30; G11C 16/08; G11C 16/10; G11C 16/26; G11C 16/3404
See application file for complete search history.

(56) References Cited

U.S. PATENT DOCUMENTS

| | | | |
|---|---|---|---|
| 10,096,367 B2 | 10/2018 | Tanikawa | |
| 11,069,415 B2 | 7/2021 | Baek et al. | |
| 11,443,816 B2 * | 9/2022 | Piccardi | G11C 29/021 |
| 2019/0019539 A1 * | 1/2019 | Michael | H02M 3/07 |
| 2020/0201418 A1 | 6/2020 | Richter et al. | |
| 2020/0365216 A1 * | 11/2020 | Baek | G11C 16/30 |
| 2021/0234460 A1 * | 7/2021 | Rana | H02M 3/07 |

* cited by examiner

*Primary Examiner* — Pho M Luu
(74) *Attorney, Agent, or Firm* — Lowenstein Sandler LLP

(57) ABSTRACT

A first digitally-controlled pump voltage level is established for a charge pump coupled to a wordline of a memory device of a memory sub-system. A determination is made whether a measured digitally-controlled voltage level of the wordline and the first digitally-controlled pump voltage level satisfy a condition. In response to determining that the condition is satisfied, a signal is generated to adjust the first digitally-controlled pump voltage level to a second digitally-controlled pump voltage level.

20 Claims, 7 Drawing Sheets

300

Establish a first digitally-controlled pump voltage level of a charge pump coupled to a wordline of a memory device of a memory sub-system
310

Determine whether a measured digitally-controlled voltage level of the wordline and the first digitally-controlled pump voltage level satisfy a condition
320

Yes

In response to determining that the condition is satisfied, cause the first digitally-controlled pump voltage level applied to the charge pump to change to a second digitally-controlled pump voltage level
330

No

In response to determining that the condition is not satisfied, maintain the first digitally-controlled pump voltage level
340

MANAGING DIGITALLY-CONTROLLED CHARGE PUMP OPERATION IN A MEMORY SUB-SYSTEM

CROSS-REFERENCE TO RELATED APPLICATION

This application is a continuation of U.S. patent application Ser. No. 17/108,293, filed on Dec. 1, 2020 know U.S. Pat. No. 11,443,816, issued on Sep. 13, 2022), the entirety of which is hereby incorporated by reference.

TECHNICAL FIELD

Embodiments of the disclosure relate generally to memory sub-systems, and more specifically, relate to managing digitally-controlled charge pump operation in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

FIG. 3 is a flow diagram of an example method to manage a digitally-controlled charge pump voltage associated with charging a wordline of a memory device of a memory sub-system, in accordance with one or more embodiments of the present disclosure.

DETAILED DESCRIPTION

Figure 1:
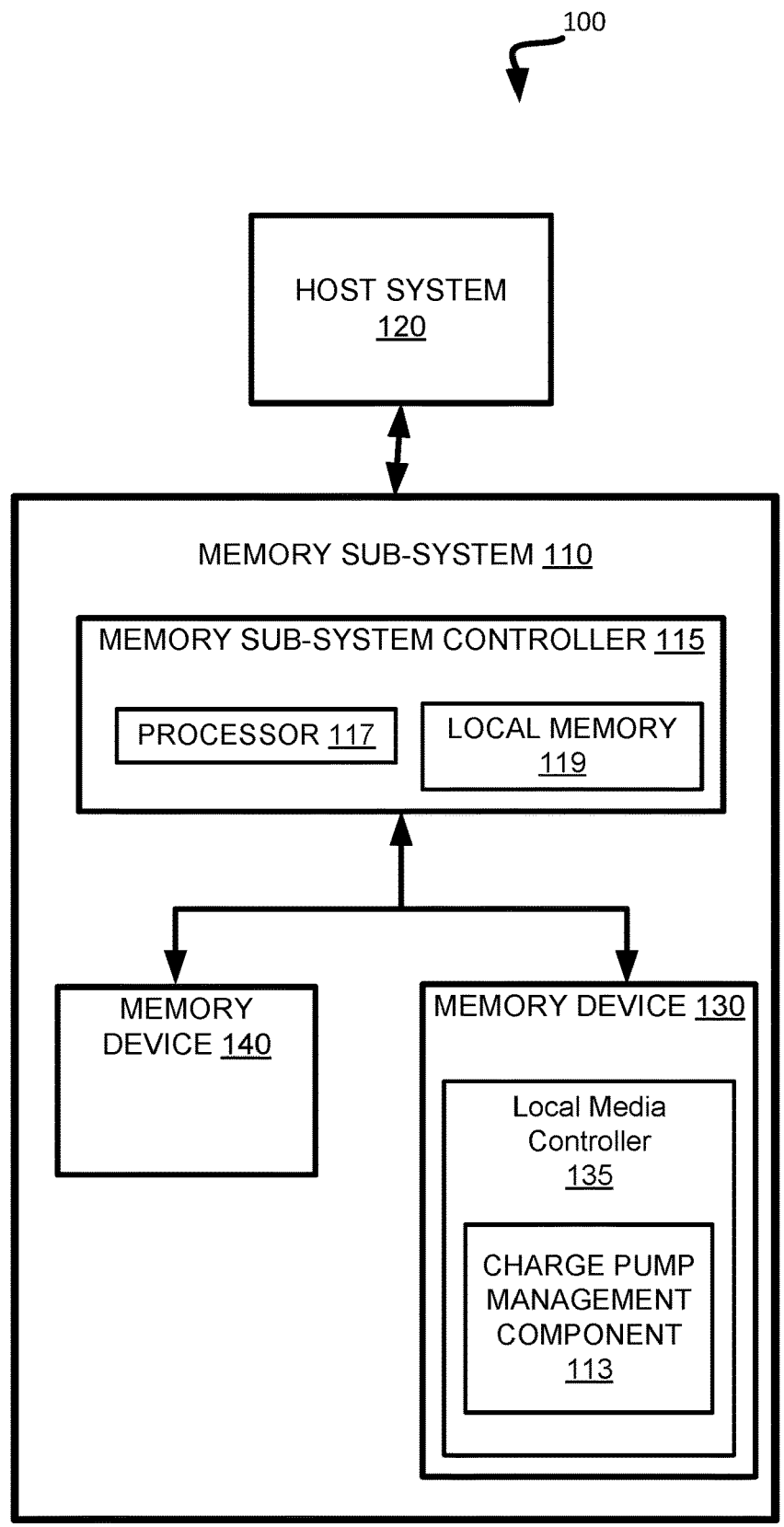
FIG. 1 illustrates an example computing system that includes a memory sub-system in accordance with some embodiments of the present disclosure.

Aspects of the present disclosure relate to managing digitally-controlled charge pump operation in a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIG. 1. A non-volatile memory device is a package of one or more memory dies. Each die can consist of one or more planes. For some types of non-volatile memory devices (e.g., NAND devices), each plane consists of a set of physical blocks. Each block consists of a set of pages. Each page consists of a set of memory cells ("cells"). A cell is an electronic circuit that stores information. Depending on the cell type, a cell can store one or more bits of binary information, and has various logic states that correlate to the number of bits being stored. The logic states can be represented by binary values, such as "0" and "1", or combinations of such values.

A memory device can be made up of bits arranged in a two-dimensional grid or a three-dimensional grid. Memory cells are formed onto a silicon wafer in an array of columns (also hereinafter referred to as "bitlines") and rows (also hereinafter referred to as "wordlines"). A wordline can refer to one or more rows of memory cells of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells.

To perform operations (e.g., read operations and program operations) relating to the wordlines of a memory device of the memory sub-system, the wordlines are charged to pass voltage levels by a charge pump (e.g. a DC-DC converter that multiplies the input Vcc supply by a factor greater than 1 such as 10 in NAND memories). The charge pump normally operates in a free-running manner while delivering charge to the memory array. In the free-running mode of operation, the resulting voltage ramp V applied to the wordlines by the charge pump has a decreasing exponential slope approximated by the following equation $V=V_{start}+V_{max}*(1-\exp(-t/C*R_{pmp}))$ where t is time, $V_{start}$ is the starting voltage of wordlines, $V_{max}$ is the maximum nominal open-load voltage of the charge pump, C is the NAND array loading and $R_{pmp}$ is the equivalent to the resistance of the charge pump. The voltage ramp will stop when the wordlines reach the target level determined by NAND operation, after this point the charge pump will proceed to reach its own regulated target voltage. The charge pump regulation voltage can be determined by establishing a desired difference (also referred to as a "headroom level" necessary to maintain any linear regulator supplied by the charge pump in optimal working condition of saturation) between the charge pump regulation voltage (e.g., 12V) and the target voltage of the wordline (e.g., 8V-10V).

Every DC-DC converter including a charge pump exhibits a current efficiency figure of merit, which is represented by a ratio of the output current generated by the charge pump over the level of current consumed by the charge pump. The current efficiency varies with the output voltage of the converter, in particular it is monotonically decreasing with the increase of the generated output voltage level. For example, if the NAND array load is to be charged from 2v to 8v to perform algorithm operations, using a charge pump at fixed target voltage level of 12v would consume more current compared to using the same charge pump at fixed target voltage level of 10v, due to the converter current efficiency being higher in the latter case.

In view of the charge pump efficiency considerations, the charge pump can be configured to operate in different stage configurations. For example, the charge pump can operate in a two-stage mode (e.g., a first charge pump stage including a capacitor connected across a voltage supply a second charge pump stage including a capacitor in series with the voltage supply and the load) to ramp the charge pump output voltage in a first range (e.g., 4V to 8V) and a four-stage mode (e.g., including third and fourth stages having respective capacitors connected in series with the voltage supply and the load) to ramp the charge pump output voltage in a second range (e.g., 8V to the charge pump regulation voltage). In operation, while each stage of the charge pump is configured to generate an intermediate boosted output voltage, the charge pump current efficiency decreases as a function of the number of stages of the charge pump increases. Accordingly, the charge pump current efficiency is lower when the charge pump operates in a four-stage mode as compared to the two-stage mode.

Furthermore, use of an unlimited or free-running charge pump to ramp the voltage of the wordlines to the target voltage level, as done in certain instances, results in a fast time to charge the memory device array load to the target voltage level while obtaining the lowest average current consumption. In this regard, when the pump operates in unlimited mode, its output voltage tracks very closely the memory device array load voltage combined with a current efficiency that monotonically decreases with output voltage of the converter.

However, use of an unlimited or free-running charge pump to ramp the voltage of the wordlines to the target voltage level results in undesirable high peak current levels and high peak power consumption levels, all of which have undesirable effects including but not limited to increased error levels associated with the read and program operations and reduced reliability of the memory device due to fast ramping by charge pumps that may cause local wordlines that lag behind global wordlines of a memory device.

Aspects of the present disclosure address the above and other deficiencies by providing a charge pump configured to apply a digitally-controlled voltage level (e.g., a pulsed or stepped voltage load) to charge one or more wordlines of a memory device to a target voltage level. In an embodiment, the output voltage of the charge pump is digitally controlled to apply a digitally controlled output voltage (e.g., ramping in a digitally-controlled staircase manner) to drive the NAND array voltage in a uniformly increasing manner. To charge the wordlines to the target voltage level with the digitally-controlled staircase approach, the charge pump is regulated by a voltage regulator to operate in a voltage range from an initial regulation voltage level to a target regulation voltage level. The target regulation voltage level of the charge pump is determined based on a headroom requirement (e.g., a difference between the target voltage level of a wordline and the charge pump regulation voltage level) associated with any linear voltage regulator supplied by the charge pump itself.

According to various embodiments, the charge pump voltage level is digitally-controlled to track the digitally-controlled wordline voltage level. The charge pump voltage level is digitally-controlled to step, update, or increase from an initial charge pump voltage level through a series of updates corresponding to an offset level until a charge pump regulation voltage threshold level is reached.

In an embodiment, the digitally-controlled charge pump voltage level is increased by an offset level in response to determining that a measured wordline voltage level satisfies a condition. In an embodiment, the condition is satisfied if a difference between the charge pump voltage level and the measured wordline voltage level is less than a threshold level corresponding to the headroom requirement (also referred to as a "headroom threshold level"). In an embodiment, the charge pump voltage level is increased by the offset level when the headroom or difference between the current charge pump voltage level and the measured wordline level is less than the headroom threshold level.

As the digitally-controlled wordline voltage level increases, at one or more wordline threshold voltage levels, a comparison of the charge pump voltage and the wordline voltage is performed to determine if the condition is satisfied (e.g., the difference between the charge pump voltage level and a measured wordline voltage level is less than the threshold level). In response to satisfying the condition, the charge pump voltage level is increased by the offset level to an updated or increased digitally-controlled charge pump voltage level. The digital controlling of the charge pump can consist of multiple steps and this process continues until the charge pump voltage level has been stepped or increased up to the charge pump regulation voltage level.

In an embodiment, one or more stage control threshold levels can be established. As the wordline voltage level reaches a stage control threshold level, the operation of the charge pump can be transitioned from a current stage mode (e.g., a two-stage mode) to an updated stage mode (e.g., a four-stage mode).

Advantageously, digitally-controlling the charge pump voltage level as a function of the wordline voltage level enables the minimization of the current consumed by the charge pump. Minimizing the current consumption of the charge pump increases the pump efficiency as compared to an unmanaged charge pump (e.g., a charge pump without digital control that operates at or near the charge pump regulation voltage during the ramping of the wordline voltage).

Furthermore, in accordance with embodiments, digitally-controlling the charge pump voltage level and charge pump stage control results in a reduction in the energy per bit of the memory sub-system compared to an unmanaged charge pump (e.g., a charge pump without digital control that operates at or near the charge pump regulation voltage during the ramping of the wordline voltage).

FIG. 1 illustrates an example computing system 100 that includes a memory sub-system 110 in accordance with one or more embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include a negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, or a QLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor 117 (e.g., processing device) configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical block address (e.g., logical block address (LBA), namespace) and a physical block address (e.g., physical block address) that are associated with the memory devices 130. The memory sub-system controller 115 can further include host interface circuitry to communicate with the host system 120 via the physical host interface. The host interface circuitry can convert the commands received from the host system 120 into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which includes a raw memory device 130 having control logic (e.g., local media controller 135) on the die and a controller (e.g., memory sub-system controller 115) for media management within the same memory device package. An example of a managed memory device is a managed NAND (MNAND) device.

In one embodiment, the memory device 130 includes a charge pump management component 113 that can be used to manage digitally-controlled charge pump voltage levels to charge one or more wordlines of a memory device 130. In some embodiments, the local media controller 135 includes at least a portion of the charge pump management component 113.

In some embodiments, the memory sub-system controller 115 includes at least a portion of the charge pump management component 113. For example, the controller 115 can include a processor 117 (processing device) configured to execute instructions stored in local memory 119 for performing the operations described herein. In some embodiments, the charge pump management component 113 is part of the host system 110, an application, or an operating system.

The charge pump management component 113 can cause a digitally-controlled voltage to be applied to a charge pump to ramp or increase a digitally-controlled voltage level of at least one selected wordline to a target wordline voltage. The charge pump management component 113 manages the digitally-controlled charge pump voltage level to track the digitally-controlled wordline voltage level. In an embodiment, the charge pump management component 113 generates the digitally-controlled charge pump voltage level to step, update, or increase from an initial charge pump voltage level through a series of updates corresponding to an offset level until a charge pump threshold voltage level (e.g., 12 volts) is reached.

In an embodiment, the charge pump management component 113 determines a measured wordline voltage level to determine if a first condition is satisfied. In an embodiment, the condition is satisfied if a difference between the charge pump voltage level and the measured wordline voltage level is less than a headroom threshold level (e.g., a selected minimum desired difference to be maintained between the charge pump voltage level and the wordline voltage level). In an embodiment, the charge pump management component 113 checks or measures the wordline voltage level at one or more times to determine if a headroom requirement is maintained or if the first condition is satisfied.

In response to determining the first condition is satisfied (i.e., the difference between a current digitally-controlled charge pump voltage level and the measured wordline voltage level is less than the headroom threshold level), the charge pump management component 113 adjusts or increases the charge pump voltage level by an offset level (e.g., 2 volts) to a stepped, adjusted, or increased charge pump voltage level.

In an embodiment, as the digitally-controlled wordline voltage level increases to one or more selected wordline voltage thresholds (e.g., wordline threshold voltages of 5 volts, 7 volts, 9 volts, 11 volts), the charge pump management component 113 compares a current charge pump voltage level and the wordline voltage level to determine if the first condition is satisfied. The charge pump management component 113 can continue the process of increasing the charge pump voltage level in response to satisfying the first condition until a charge pump regulation threshold voltage level is reached.

In an embodiment, the charge pump management component 113 can manage operation of the charge pump in multiple stage modes (e.g., a two-stage mode, a four-stage mode, etc.). The charge pump management component 113 can adjust or change the operation of the charge pump from a current stage mode (e.g., a two-stage mode) to an updated stage mode (e.g., a four-stage mode) in response to determining a second condition is satisfied. In an embodiment, the second condition is satisfied if the wordline voltage level reaches a stage control threshold level. In an embodiment, upon determining the wordline voltage level reaches or exceeds a stage control threshold level, the charge pump management component 113 transitions the charge pump from a current stage mode (e.g., a two-stage mode) to an updated stage mode (e.g., a four-stage mode). In an embodiment, the charge pump management component 113 can monitor and maintain any number of different stage control threshold levels such that the charge pump stage mode is updated in response to reaching or exceeding each of the stage control threshold levels. Further details with regards to the operations of the charge pump management component 113 are described below.

Figure 2:
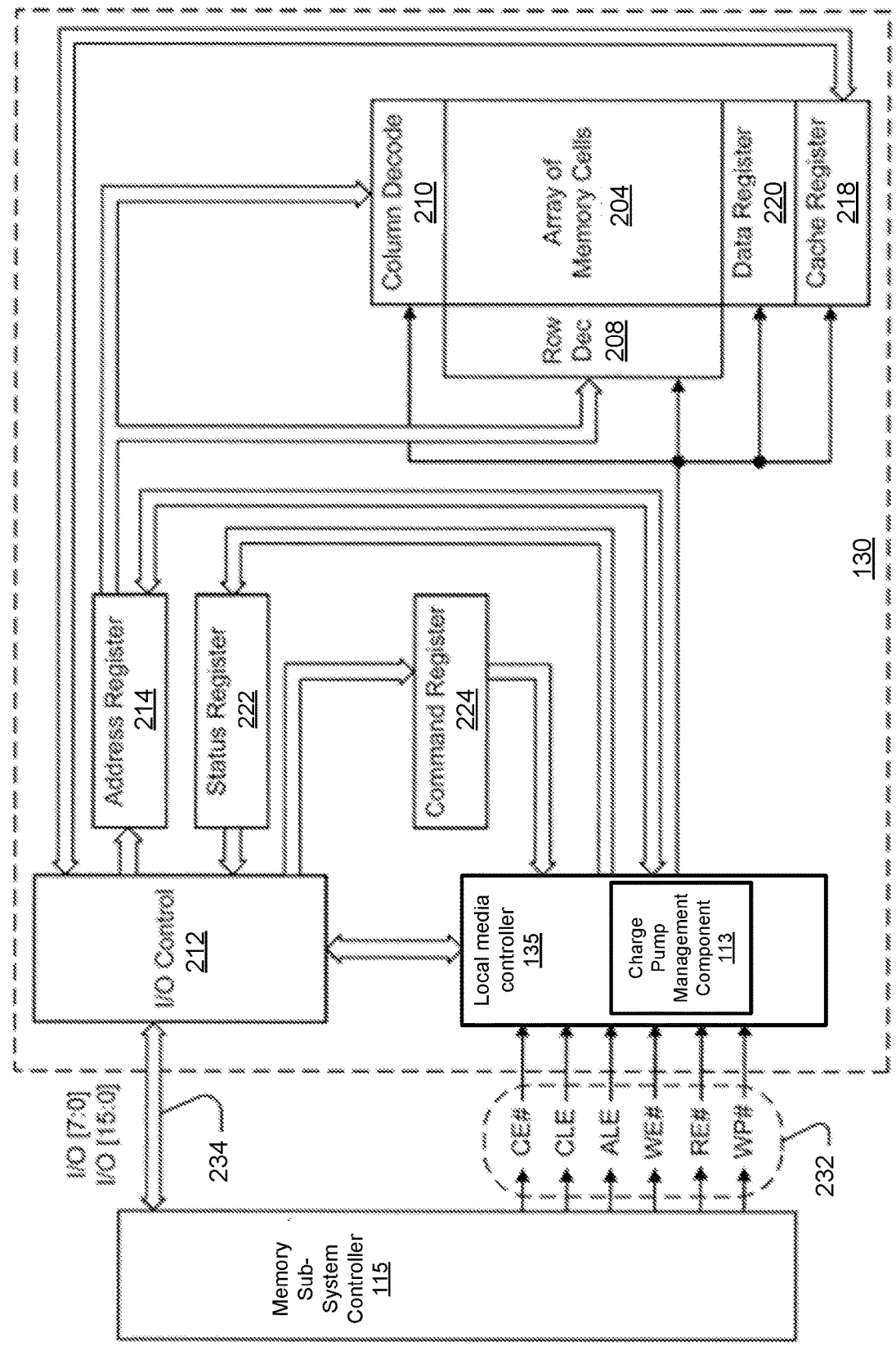
FIG. 2 is a block diagram of a memory device in communication with a memory sub-system controller of a memory sub-system, in accordance with one or more embodiments of the present disclosure.

FIG. 2 is a simplified block diagram of a first apparatus, in the form of a memory device 130, in communication with a second apparatus, in the form of a memory sub-system controller 115 of a memory sub-system (e.g., memory sub-system 110 of FIG. 1), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130 of FIG. 1), may be a memory controller or other external host device.

Memory device 130 includes an array of memory cells 204 logically arranged in rows and columns. Memory cells of a logical row are typically connected to the same access line (e.g., a word line) while memory cells of a logical column are typically selectively connected to the same data line (e.g., a bit line). A single access line may be associated with more than one logical row of memory cells and a single data line may be associated with more than one logical column. Memory cells (not shown in FIG. 2) of at least a portion of array of memory cells 204 are capable of being programmed to one of at least two target data states.

Row decode circuitry 208 and column decode circuitry 210 are provided to decode address signals. Address signals are received and decoded to access the array of memory cells 204. Memory device 130 also includes input/output (I/O) control circuitry 212 to manage input of commands, addresses and data to the memory device 130 as well as output of data and status information from the memory device 130. An address register 214 is in communication with I/O control circuitry 212 and row decode circuitry 208 and column decode circuitry 210 to latch the address signals prior to decoding. A command register 224 is in communication with I/O control circuitry 212 and control logic 216 to latch incoming commands.

A controller (e.g., the local media controller 135 internal to the memory device 130) controls access to the array of memory cells 204 in response to the commands and generates status information for the external memory sub-system controller 115, i.e., the local media controller 135 is configured to perform access operations (e.g., read operations, programming operations and/or erase operations) on the array of memory cells 204. The local media controller 135 is in communication with row decode circuitry 208 and column decode circuitry 210 to control the row decode circuitry 208 and column decode circuitry 210 in response to the addresses.

The local media controller 135 is also in communication with a cache register 218. Cache register 218 latches data, either incoming or outgoing, as directed by the local media controller 135 to temporarily store data while the array of memory cells 204 is busy writing or reading, respectively, other data. During a programming operation (e.g., write operation), data may be passed from the cache register 218 to the data register 22 for transfer to the array of memory cells 204; then new data may be latched in the cache register 218 from the I/O control circuitry 212. During a read operation, data may be passed from the cache register 218 to the I/O control circuitry 212 for output to the memory sub-system controller 115; then new data may be passed from the data register 220 to the cache register 218. The cache register 218 and/or the data register 220 may form (e.g., may form a portion of) a page buffer of the memory device 130. A page buffer may further include sensing devices (not shown in FIG. 2) to sense a data state of a memory cell of the array of memory cells 204, e.g., by sensing a state of a data line connected to that memory cell. A status register 222 may be in communication with I/O control circuitry 212 and the local memory controller 135 to latch the status information for output to the memory sub-system controller 115.

Memory device 130 receives control signals at the memory sub-system controller 115 from the local media controller 135 over a control link 232. For example, the control signals may include a chip enable CE #, a command latch enable CLE, an address latch enable ALE, a write enable WE #, a read enable RE #, and a write protect WP #. Additional or alternative control signals (not shown) may be further received over control link 232 depending upon the nature of the memory device 130. Memory device 130 receives command signals (which represent commands), address signals (which represent addresses), and data signals (which represent data) from the memory sub-system controller 115 over a multiplexed input/output (I/O) bus 234 and outputs data to the memory sub-system controller 115 over I/O bus 234.

For example, the commands may be received over input/output (I/O) pins [7:0] of I/O bus 234 at I/O control circuitry 212 and may then be written into command register 224. The addresses may be received over input/output (I/O) pins [7:0] of I/O bus 234 at I/O control circuitry 212 and may then be written into address register 214. The data may be received over input/output (I/O) pins [7:0] for an 8-bit device or input/output (I/O) pins [15:0] for a 16-bit device at I/O control circuitry 212 and then may be written into cache register 218. The data may be subsequently written into data register 220 for programming the array of memory cells 204.

In an embodiment, cache register 218 may be omitted, and the data may be written directly into data register 220. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 2 has been simplified. It should be recognized that the functionality of the various block components described with reference to FIG. 2 may not necessarily be segregated to distinct components or component portions of an integrated circuit device. For example, a single component or component portion of an integrated circuit device could be adapted to perform the functionality of more than one block component of FIG. 2. Alternatively, one or more components or component portions of an integrated circuit device could be combined to perform the functionality of a single block component of FIG. 2.

Additionally, while specific I/O pins are described in accordance with popular conventions for receipt and output of the various signals, it is noted that other combinations or numbers of I/O pins (or other I/O node structures) may be used in the various embodiments.

FIG. 3 is a flow diagram of an example method 300 to manage a digitally-controlled charge pump voltage level to increase or ramp a digitally-controlled wordline voltage level associated with a wordline associated with a memory cell of a memory sub-system, in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the charge pump management component 113 of FIG. 1.

At operation 310, a pump voltage level is established. For example, the processing logic (e.g., charge pump management component 113) establishes a first digitally-controlled pump voltage level to a charge pump coupled to a wordline of a memory device of a memory sub-system. In an embodiment, the established first digitally-controlled pump voltage level causes the charge pump to generate an output voltage to be applied to the wordline to ramp or increase a voltage level of the wordline (also referred to as a "wordline voltage level") to a target wordline voltage level. In an embodiment, a DAC (Digital-Analog-Converter) is employed to digitally-control the pump voltage level of the charge pump. In an embodiment, the processing device generates a series of update command or signals to increase the pump voltage level in a series of stepped voltages (e.g., a series of voltage levels increased by an offset level) until the charge pump voltage reaches a charge pump threshold voltage level (e.g., 12 volts).

In an embodiment, the wordline voltage level established by the charge pump is a stepped or staircase voltage that is digitally-controlled using a DAC to ramp the wordline to a target wordline voltage (e.g., a voltage level associated with an operation relating to the wordline such as a read operation or program operation) via a series of stepped voltage increments.

In operation 320, an evaluation is made. For example, the processing logic determines whether a measured digitally-controlled voltage level of the wordline and the first digitally-controlled pump voltage level satisfy a condition. In an embodiment, the condition is satisfied if a difference between the measured digitally-controlled voltage level of the wordline and the first digitally-controlled pump voltage level is less than or equal to a threshold level (e.g., a headroom threshold level).

In operation 330, a voltage is increased. For example, in response to determining that the condition is satisfied in operation 320, the processing logic causes the first digitally-controlled pump voltage level applied to the charge pump to change to a second digitally-controlled pump voltage level. In an embodiment, the processing logic updates or increases the first digitally-controlled pump voltage level by the offset voltage level (e.g., 2 volts) to change to and establish the second digitally-controlled pump voltage. In an embodiment, as shown in operation 340, if the condition is not satisfied, the first digitally-controlled pump voltage level is maintained.

Figure 4:
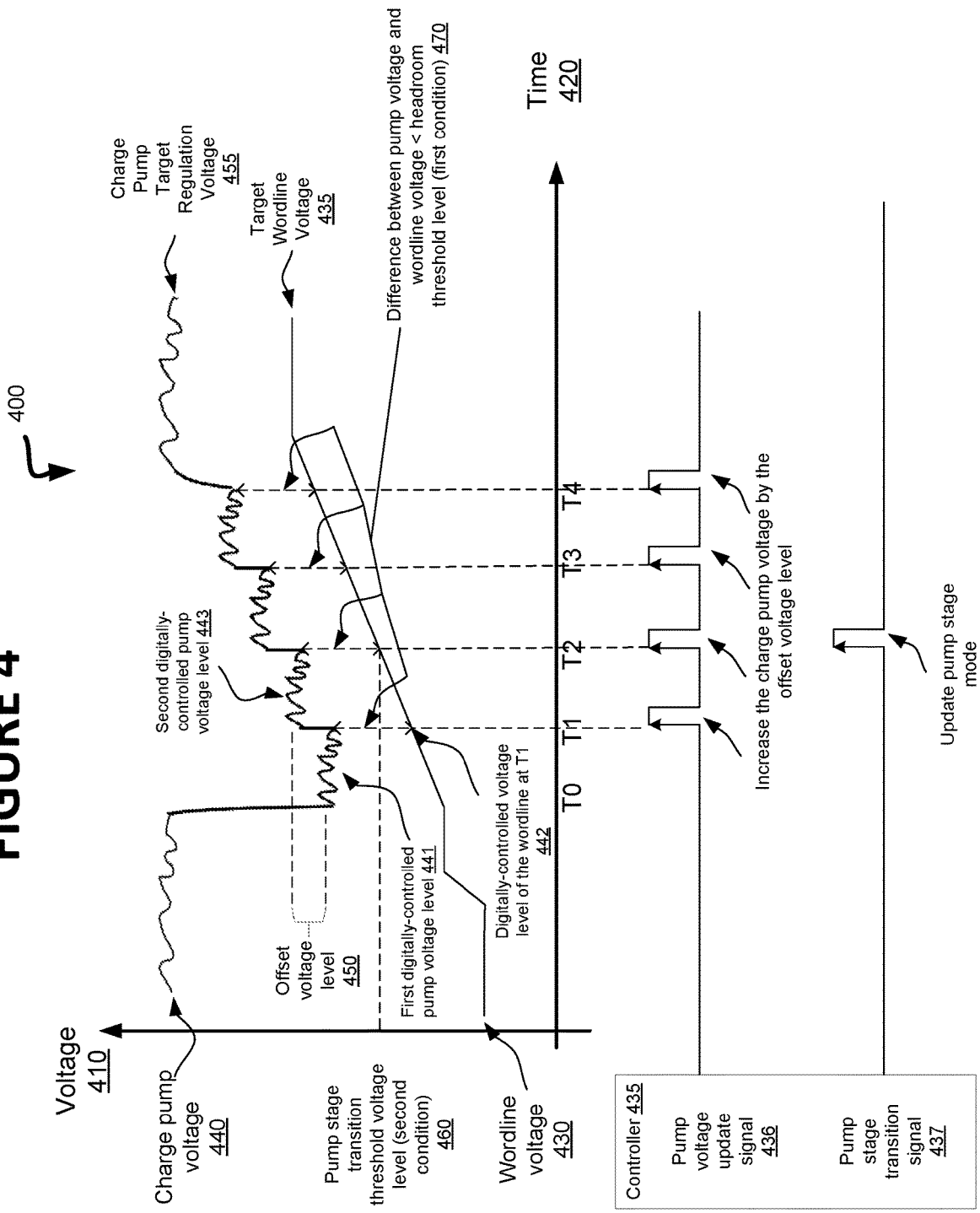
FIG. 4 illustrates an example graph including a representation of digitally-controlled charge pump voltage levels associated with charging of digitally-controlled wordlines and corresponding controller operation, in accordance with one or more embodiments of the present disclosure.

FIG. 4 illustrates an example graph 400 representing a plot of voltage 410 associated with a wordline (i.e., wordline voltage 430) and a charge pump voltage (i.e., charge pump voltage 440) over time 420 as managed by the charge pump management component of the controller. As shown in FIG. 4, operation of the charge pump 440 can be initiated at time T0 to set the charge pump voltage 440 to a first digitally-controlled pump voltage level 341. In operation, the charge pump voltage 440 is digitally-controlled (e.g., using a DAC) to generate a series of stepped voltage levels increased by an offset voltage level 450 (e.g., 2 volts) until the charge pump target regulation voltage 455 is reached. In an embodiment, the charge pump voltage 440 causes a digitally-controlled wordline voltage 430 to increase until a target wordline voltage 435 is reached.

As shown in FIG. 4, at time T1, the processing logic checks the difference between the first digitally-controlled pump voltage level 441 and the digitally-controlled voltage level of the wordline 442 to determine if the headroom requirement has been maintained (e.g., the difference between the two voltages values is greater than the headroom threshold level). In the example shown in FIG. 4, the processing logic determines that the difference between the first digitally-controlled pump voltage level 441 and the digitally-controlled voltage level of the wordline 442 is less than the headroom threshold level (e.g., 1 volt), and, therefore, the first condition is satisfied 470.

In the example shown in FIG. 4, in response to the satisfaction of the first condition 470 at T1, the controller 435 transmits a signal 436 to cause an increase of the charge pump voltage 340 from the first digitally-controlled pump voltage level 441 to the second digitally-controlled pump voltage level 443.

In an embodiment, the operations of method 400 can be executed iteratively by the processing device to ramp up the wordline voltage to the target wordline voltage using a series of pump voltage update signals to increase the charge pump voltage level in response to satisfying the condition (i.e., when the difference between the pump voltage and the wordline voltage is less than or equal to the headroom requirement). For example, as shown in FIG. 4, the controller 435 can issue pump voltage update signals 436 at times T1, T2, T3, and T4 in response to a determination that a difference between a level of the wordline voltage 430 and a level of the charge pump voltage 340 is less than the headroom threshold level.

Figure 5:
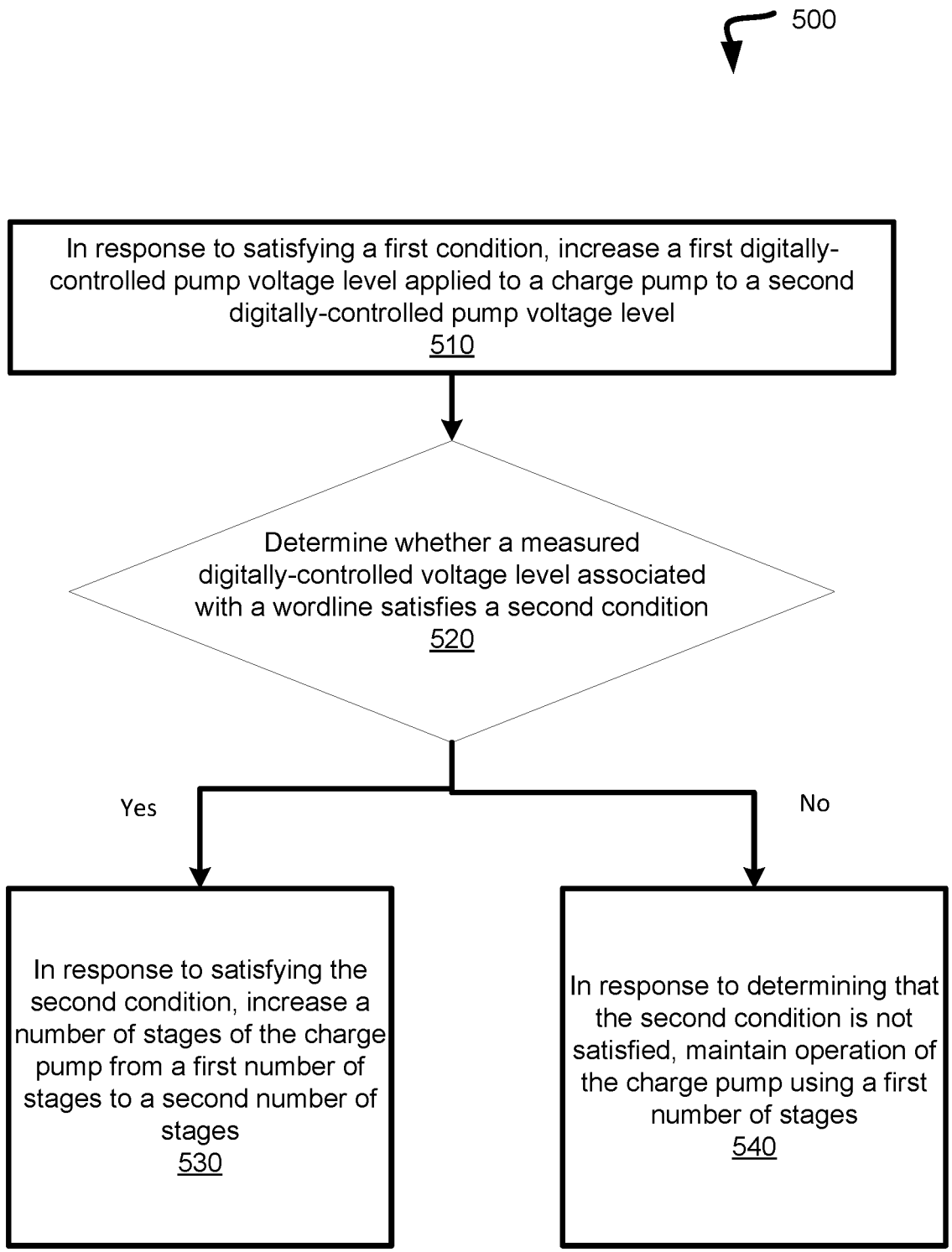
FIG. 5 is a flow diagram of an example method to manage digitally-controlled charge pump voltage levels and stage mode transitions of a charge pump, in accordance with one or more embodiments of the present disclosure.

FIG. 5 is a flow diagram of an example method 500 to manage a digitally-controlled charge pump voltage level and charge pump stage mode of a charge pump to increase or ramp a digitally-controlled wordline voltage level associated with a wordline associated with a memory cell of a memory sub-system, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 500 is managed by the charge pump management component 113 of FIG. 1. In an embodiment, the operations 510-540 of method 500 can be performed following the execution of the operations of the method 300 described above in connection with FIGS. 3 and 4.

At operation 5310, a digitally-controlled voltage level is increased. For example, in response to satisfying a first condition (e.g., the condition in operation 330 of FIG. 3 or the first condition 470 of FIG. 4), the processing logic increases a first digitally-controlled pump voltage level applied to a charge pump to a second digitally-controlled pump voltage level. In an embodiment, the processing logic updates or increases the first digitally-controlled pump voltage level by the offset voltage level (e.g., 2 volts) to establish the second digitally-controlled pump voltage. As described above and shown in FIG. 4, in response to the satisfaction of the first condition 470 at T1, the controller 435 transmits a signal 436 to cause an increase of the charge pump voltage 440 from the first digitally-controlled pump voltage level 441 to the second digitally-controlled pump voltage level 443.

At operation 520, a determination is made. For example, the processing logic determines whether a measured digitally-controlled voltage level of the wordline satisfies a second condition. In an embodiment, the second condition is satisfied if the wordline voltage level exceeds a threshold voltage level (also referred to as a "pump stage mode threshold"). As shown in FIG. 4, at T2, the processing logic of the controller 435 determines that the wordline voltage level is greater than or equal to a pump stage transition threshold voltage level (e.g., the second condition) 460. In an embodiment, the pump stage transition threshold voltage level is a voltage level (e.g., 8 volts) at which the processing logic transitions the charge pump from a first stage mode (e.g., a two-stage mode) to a second stage mode (e.g., a four-stage mode) to improve charge pump efficiency. In an embodiment, although FIG. 4 illustrates one pump stage transition threshold voltage level, any number of pump stage transition threshold voltage level can be employed such that the stage mode can be transitioned to an updated number of stages in response to reaching the corresponding pump stage transition threshold voltage level.

At operation 530, a number of pump stages is increased. For example, in response to determining that the second condition is satisfied, the processing logic increases a number of stages of the charge pump from a first number of stages to a second number of stages. For example, in operation 430, the processing logic can increase the charge pump from two-stage operation to four-stage operation. In an embodiment, as shown in operation 540, if the second condition is not satisfied, the charge pump continues to operate using a first number of stages (e.g., a number of stages of the charge pump is not changed if the second condition is not satisfied).

In the example shown in FIG. 4, at T2, the controller 435 generates a pump stage transition signal 437 to update the pump stage mode of the charge pump. In FIG. 4, in response to the pump stage transition signal 437, at T2, the charge pump is transitioned to an updated stage mode to improve the efficiency of the charge pump.

Figure 6:
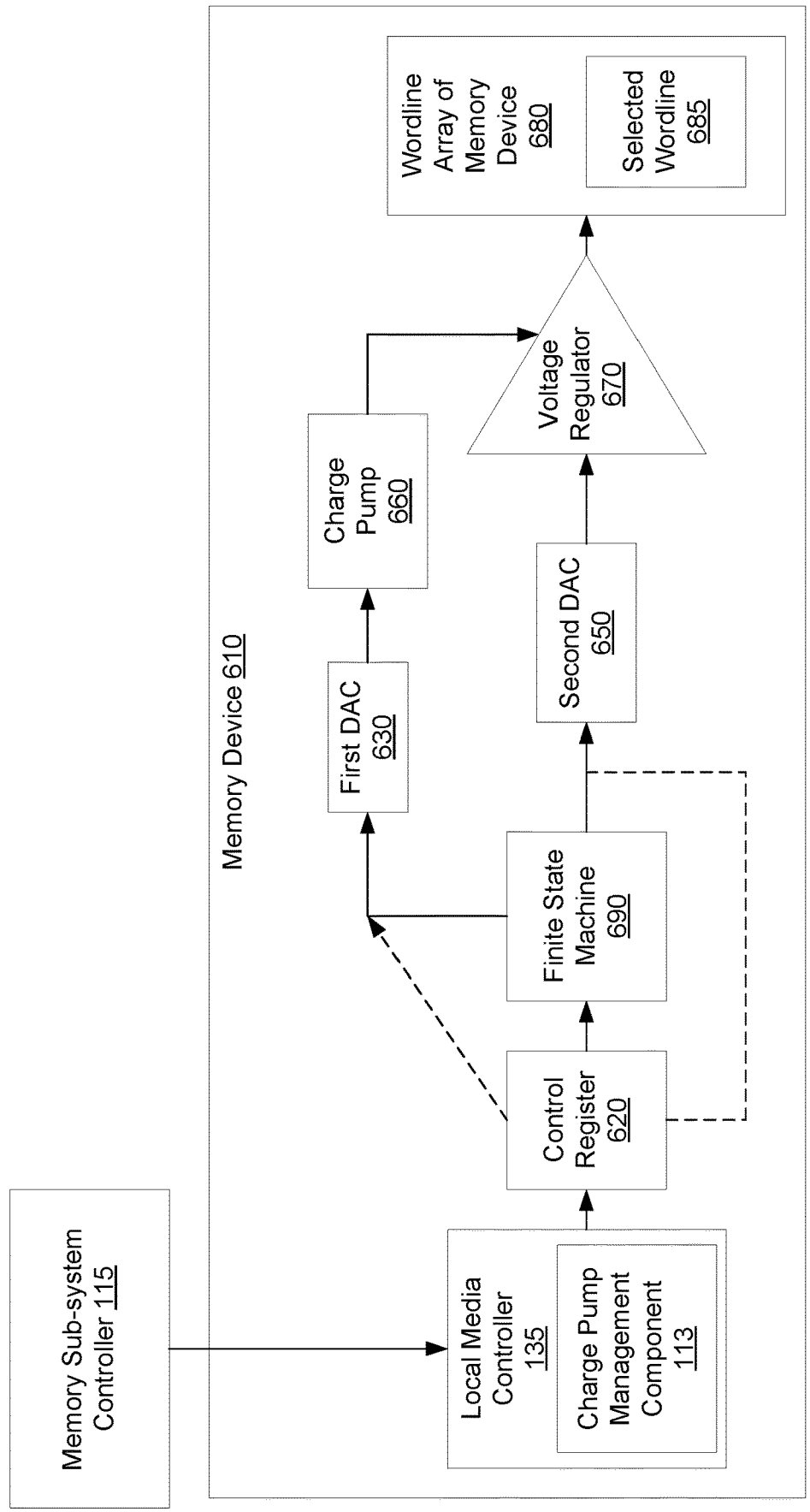
FIG. 6 is a schematic diagram of an example memory device including a charge pump management component, in accordance with one or more embodiments of the present disclosure.

FIG. 6 illustrates a schematic diagram including a memory device 610 including a charge pump management component 113 according to embodiments of the present disclosure. As shown in FIG. 65, in an embodiment, the charge pump management component 113 is a part of a local media controller 135 of the memory device 610 including an array of wordlines of a memory die 680 including a selected wordline 685 to be ramped to a target wordline voltage level. In an embodiment, the charge pump management component 113 transmits commands or signals to a control register 620 to control a first DAC 630 associated with a charge pump 660 and a second DAC 650 coupled to a voltage regulator 670 configured to apply a voltage level to the selected wordline 685, as denoted by the dashed lines in FIG. 6.

In an embodiment, the charge pump management component 113 generates signals to establish an output voltage of the charge pump 660 (e.g., a charge pump voltage level) to be applied to the selected wordline 685 via the voltage regulator 670.

In an embodiment, a finite state machine 690 can be provided between the control register 620 and the DACs (e.g., the first DAC 530 and the second DAC 650). The finite state machine 690 can be configured to start in response to a pulse received from the control register to perform operations to control the charge pump DAC 630 and the wordline DAC 650. In an embodiment, the finite state machine 690 can be configured to apply a pulse to increase the charge pump 660 from a current pump voltage level to a next pump voltage level (e.g., a level increased by the offset voltage threshold amount).

In an embodiment, a memory sub-system controller 115 (e.g., a host controller) can send commands to the charge pump management component 113 to initiate the execution of the digitally-controlled management of the charge pump to perform the functions and operations described herein (e.g., execution of methods 300 and 500 of FIGS. 3 and 5, respectively). In an embodiment, the charge pump management component 113 digitally-controls the charge pump voltage level to enable the charge pump 635 to efficiently ramp to a charge pump threshold voltage while applying a load to ramp the selected wordline 685 to a target wordline voltage with slew-rate control.

Figure 7:
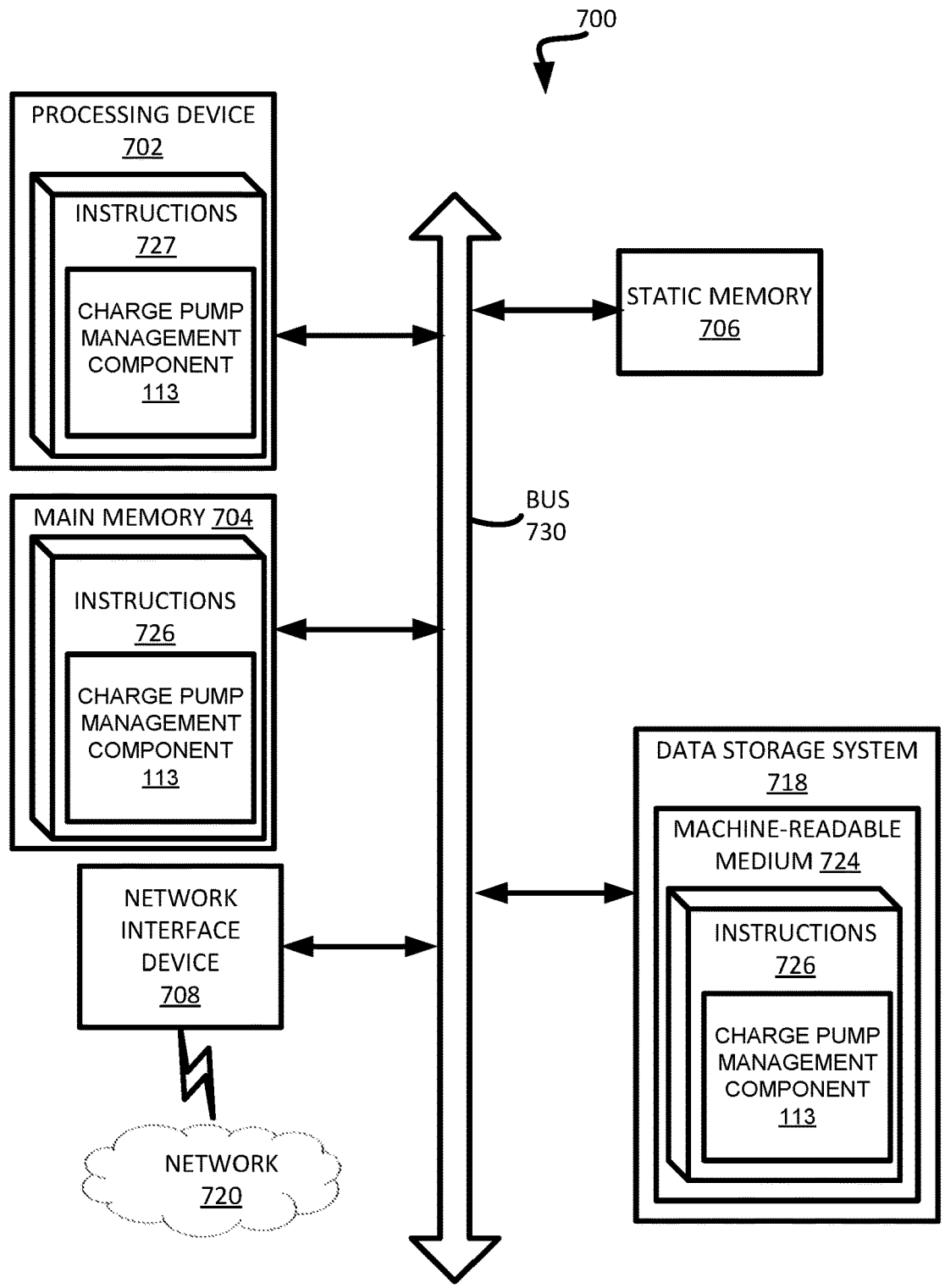
FIG. 7 is a block diagram of an example computer system in which implementations of the present disclosure can operate.

FIG. 7 illustrates an example machine of a computer system 700 within which a set of instructions, for causing the machine to perform any one or more of the methodologies discussed herein, can be executed. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the charge pump management 113 of FIGS. 1 and 5). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage system 718, which communicate with each other via a bus 730.

Processing device 702 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 702 can also be one or more special-purpose processing devices such as an application specific integrated circuit (ASIC), a field programmable gate array (FPGA), a digital signal processor (DSP), network processor, or the like. The processing device 702 is configured to execute instructions 726 for performing the operations and steps discussed herein. The computer system 700 can further include a network interface device 708 to communicate over the network 720.

The data storage system 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage system 718, and/or main memory 704 can correspond to the memory sub-system 110 of FIG. 1.

In one embodiment, the instructions 726 include instructions to implement functionality corresponding to a selective relocation component (e.g., the charge pump management component 113 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A memory device comprising:
a memory array; and
control logic, operatively coupled with the memory array, to perform operations comprising:
determining that a measured digitally-controlled voltage level of a wordline associated with the memory array satisfies a condition; and
in response to determining that the condition is satisfied, adjusting a number of stages of a charge pump from a first number of stages to a second number of stages.

2. The memory device of claim 1, wherein the condition is satisfied when the measured digitally-controlled voltage level exceeds a threshold voltage level.

3. The memory device of claim 1, the operations further comprising maintaining a set of threshold voltage levels.

4. The memory device of claim 3, wherein each threshold voltage level of the set of threshold voltage levels is associated with a corresponding number of stages of the charge pump.

5. The memory device of claim 4, wherein adjusting the number of the stages of the charge pump is adjusted to the corresponding number of stages associated with a threshold voltage level.

6. The memory device of claim 1, wherein the second number of stages is greater than the first number of stages.

7. The memory device of claim 6, wherein the measured digitally-controlled voltage level associated with the wordline is increased.

8. A memory device comprising:
a memory array; and
control logic, operatively coupled with the memory array, to perform operations comprising:
establishing a first digitally-controlled pump voltage level of a charge pump coupled to a wordline associated with the memory array;
determining that a measured digitally-controlled voltage level of the wordline and the first digitally-controlled pump voltage level satisfy a condition; and
in response to determining that the condition is satisfied, generating a signal to adjust the first digitally-controlled pump voltage level to a second digitally-controlled pump voltage level.

9. The memory device of claim 8, wherein the condition is satisfied when a difference between the measured digitally-controlled voltage level of the wordline and the first digitally-controlled pump voltage level is less than or equal to a threshold level.

10. The memory device of claim 8, the operations further comprising causing, in view of the signal, the first digitally-controlled pump voltage level applied to the charge pump to change to the second digitally-controlled pump voltage level.

11. The memory device of claim 8, the operations further comprising causing the charge pump to establish a target wordline voltage level of the wordline.

12. The memory device of claim 8, the operations further comprising:
determining the measured digitally-controlled voltage level satisfies a pump stage condition; and
in response to satisfying the pump stage condition, increasing a number of stages of the charge pump from a first number of stages to a second number of stages.

13. The memory device of claim 12, wherein the pump stage condition is satisfied when the measured digitally-controlled voltage level exceeds a threshold voltage level.

14. A memory device comprising:
a memory array comprising a wordline; and
control logic, operatively coupled with the memory array, to perform operations comprising:
establishing a first digitally-controlled pump voltage level of a charge pump coupled to a wordline associated with the memory array;
determining that a first measured digitally-controlled voltage level of the wordline and the first digitally-controlled pump voltage level satisfy a first condition;
in response to determining that the first condition is satisfied, generating a signal to adjust the first digitally-controlled pump voltage level to a second digitally-controlled pump voltage level;
determining that a second measured digitally-controlled voltage level of a wordline associated with the memory array satisfies a second condition; and
in response to determining that the second condition is satisfied, adjusting a number of stages of the charge pump from a first number of stages to a second number of stages.

15. The memory device of claim 14, wherein the first condition is satisfied when a difference between the first measured digitally-controlled voltage level of the wordline and the first digitally-controlled pump voltage level is less than or equal to a threshold level.

16. The memory device of claim 14, the operations further comprising causing, in view of the signal, the first digitally-controlled pump voltage level applied to the charge pump to change to the second digitally-controlled pump voltage level.

17. The memory device of claim 14, wherein the second condition is satisfied when the second measured digitally-controlled voltage level exceeds a threshold voltage level.

18. The memory device of claim 14, the operations further comprising maintaining a set of threshold voltage levels.

19. The memory device of claim 18, wherein each threshold voltage level of the set of threshold voltage levels is associated with a corresponding number of stages of the charge pump.

20. The memory device of claim 14, wherein the second number of stages is greater than the first number of stages; and wherein the second measured digitally-controlled voltage level associated with the wordline is increased.

* * * * *